(12) United States Patent
Brueggen (10) Patent No.: US 8,205,146 B2
(45) Date of Patent: Jun. 19, 2012

(54) PERSISTENT ERROR DETECTION IN DIGITAL MEMORY

(75) Inventor: Christopher Michael Brueggen, Allen, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1918 days.

(21) Appl. No.: 11/186,372

(22) Filed: Jul. 21, 2005

(65) Prior Publication Data

US 2007/0033488 A1 Feb. 8, 2007

(51) Int. Cl.
*G06F 11/14* (2006.01)
*G06F 11/36* (2006.01)

(52) U.S. Cl. .......................... 714/799; 714/723
(58) Field of Classification Search .................. None
See application file for complete search history.

(56) References Cited

U.S. PATENT DOCUMENTS

| | | | |
|---|---|---|---|
| 4,209,846 A | 6/1980 | Seppa | |
| 4,394,763 A * | 7/1983 | Nagano et al. | 714/6 |
| 5,321,697 A * | 6/1994 | Fromm et al. | 714/6.32 |
| 6,043,946 A | 3/2000 | Genheimer et al. | |
| 6,125,469 A | 9/2000 | Zook et al. | |
| 6,438,651 B1 * | 8/2002 | Slane | 711/118 |
| 6,553,533 B2 | 4/2003 | Demura et al. | |
| 6,625,685 B1 * | 9/2003 | Cho et al. | 711/5 |
| 6,732,325 B1 | 5/2004 | Tash et al. | |
| 2002/0016942 A1 | 2/2002 | MacLaren et al. | |
| 2004/0039866 A1 * | 2/2004 | Cheung | 710/305 |
| 2004/0049629 A1 * | 3/2004 | Miura et al. | 711/105 |
| 2004/0193777 A1 * | 9/2004 | LaBerge | 711/5 |
| 2005/0050305 A1 * | 3/2005 | Kissell | 712/220 |
| 2005/0160326 A1 * | 7/2005 | Boatright et al. | 714/47 |

FOREIGN PATENT DOCUMENTS

JP     56037896 A  *  4/1981 .................. 714/758

* cited by examiner

*Primary Examiner* — Jeffrey A Gaffin
*Assistant Examiner* — Dipakkumar Gandhi (57) ABSTRACT

A method for detecting a persistent error in a digital memory is provided. Error location information for errors detected in the digital memory is received. A group of the errors that are associated with a same error position is identified from the error location information. A number of the errors of the group that are associated with a same area of the digital memory is identified. A persistent error is determined based upon the number of the errors of the group.

31 Claims, 6 Drawing Sheets

PERSISTENT ERROR DETECTION IN DIGITAL MEMORY

BACKGROUND

Virtually all digital electronic devices manufactured today employ some form of digital memory for data storage. Desktop and laptop computers, personal digital assistants (PDAs), cellular phones, and digital audio devices like Motion Picture Experts Group, audio layer 3 (MP3) players are just a few examples of the myriad types of digital devices employing digital memory. Further, the physical media for digital memory may take various forms, such as magnetic tape, magnetic disc (such as in a hard disk drive, or HDD), optical disc (such as a compact disc (CD) or a digital versatile disc (DVD)), integrated circuit (IC) memory (such as various types of read-only memory (ROM), static random-access memory (SRAM), and dynamic random-access memory (DRAM)) and others.

Generally, a digital memory contains many separate memory locations, each of which may be individually addressed for data storage and retrieval. More specifically, digital data are stored on, or "written to," specific addressable memory locations of the digital memory for later access. When subsequent access to that same data is necessary, the corresponding data is retrieved, or "read from," the same addressable location. Each addressable location of the memory may store anywhere from a single binary digit ("bit") to many "bytes," or groups of bits, of digital data, depending on the particular memory technology, memory organization, and other factors. Further, access to the various memory locations may be performed sequentially (in the case of tape), more directly (as in the case of disc), randomly (in the case of RAM), or by way of some other access method.

Due to particular physical characteristics exhibited by each type of digital memory currently available, digital memory is often susceptible to data errors, in which data read from an addressable location of the memory is not the same as that which was previously written to that location. Physical defects in the actual recording media, unintended alterations in the data after storage in the memory, electrical noise causing errors during reading of the data, and other maladies typically cause such errors. Some errors may be of a transient nature, whereby a particular memory location only occasionally produces a data error, while others may be of a more permanent or persistent nature, depending on the particular cause of the error.

To exacerbate the data error problem, the amount of digital storage required for electronic devices has generally increased over time, regardless of the nature of the device, or the type of digital memory incorporated therein. To provide increased memory capacity, the physical size occupied by each quantum of data, such as a bit, typically decreases accordingly. Due to the physical characteristics of the particular recording media employed, this reduction in size is often associated with a commensurate increase in the number of persistent and transient defects encountered per memory location. For example, an optical disc with a certain size defect on its surface will likely affect more bits or memory locations on a higher capacity disc when compared to a comparable defect of a lower capacity disc, due in part to the smaller area occupied by each bit on the higher capacity disc.

While some types of digital data, such as audio or video data, may withstand low levels of data errors with little deleterious effect, most forms of data are required to be protected against substantially all data corruption. In response, many different error detection and correction schemes for digital memory have been devised. Generally, error detection schemes indicate the presence of an error in an addressable memory location when previously-stored data at that location is read, thus indicating when retrieved data is unreliable or corrupted. Error correction schemes both detect and correct such errors. Oftentimes, error detection and correction schemes are implemented by way of additional redundancy bits or bytes stored along with the data bits or bytes at each addressable location of the recording media. With respect to error correction, the redundancy information is often referred to as an error correction code (ECC). Generally speaking, the higher the ratio of ECC bits to data bits stored within a particular memory location, the greater the number of errors at the location that are correctable.

Error correction mechanisms ranging from simple bit parity schemes to complex block-oriented algorithms employ the data and ECC information in tandem to detect and correct errors. In recent years, the capability of error correction schemes has progressed such that increasing numbers and types of errors are routinely correctable. As a result, minor data errors within a memory location are routinely corrected as part of the data retrieval process. In particular forms of digital memory, such as magnetic and optical discs, wherein spare memory locations are typically allocated and readily available for replacement of persistently defective data, replacement of a defective memory location is typically postponed until the defects surpass a predetermined threshold. Thus, memory locations exhibiting small, correctable levels of defects are often tolerated before more heroic measures, such as memory location or media replacement, is undertaken.

In many cases, the capability of error correction schemes may be extended by way of additional information concerning the data errors encountered. More specifically, if the relative position of one or more possible errors within an addressable memory location is provided to the error correction algorithm, the number of errors correctable by the algorithm within that location may be increased, in some cases by a factor of two or more, by way of a special "erasure" correction mode. As employed in magnetic and optical disc memory systems, information concerning these relative positions, sometimes called erasure pointers, is produced from read channel errors and other sources of error information. Alternatively, in the case of IC memory, previous detection of persistent errors encountered within the same memory location may form the basis of erasure pointers.

In addition to the relative position of a persistent error, the extent, or "scope" of the persistent error is also valuable in extending error correction capability. In other words, a particular persistent error may adversely affect more than a single addressable location. For example, several memory locations, or even extremely large groups of addressable locations that are associated in some fashion, may all exhibit related data errors as a result of a single memory defect. How the affected memory locations are related is often determined by the physical characteristics of the digital memory media, the organization and interconnection of the memory locations, and other factors.

SUMMARY

One embodiment of the present invention provides a method for detecting a persistent error in a digital memory. Error location information for errors detected in the digital memory is received. A group of the errors that are associated with the same error position is identified from the error location information. A number of the errors of the group that are associated with the same area of the digital memory is identified. Determination of a persistent error is based upon the number of the errors of the group.

In another embodiment of the invention, an apparatus for detecting a persistent error in a digital memory includes a buffer configured to receive error location information for errors detected in the digital memory. The error location information includes an error position for each of the errors, and a subdivision of the digital memory for each of the errors. Also included is a persistent error detection circuit coupled with the buffer and configured to identify from the error location information a group of the errors that are associated with a first error position. The circuit is also configured to identify a number of the errors of the group that are associated with a first subdivision of the digital memory, and determine a persistent error based upon the number of the errors of the group.

Additional embodiments and advantages of the present invention will be realized by those skilled in the art upon perusal of the following detailed description, taken in conjunction with the accompanying drawings.

DETAILED DESCRIPTION

Figure 1:
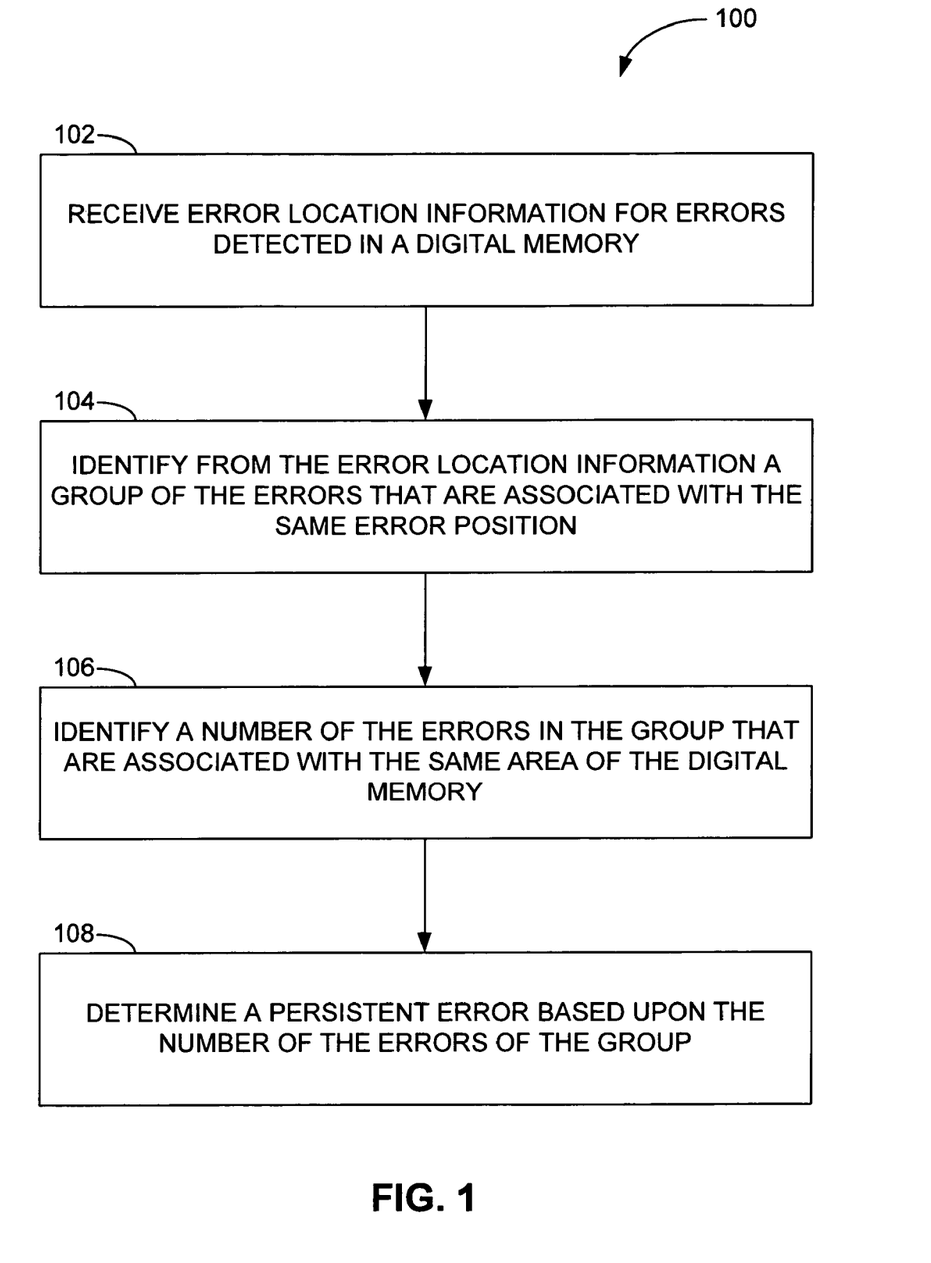
FIG. 1 is a flow chart of a method for detecting a persistent error in a digital memory according to an embodiment of the invention.

FIG. 1 depicts a method 100 for detecting a persistent error in a digital memory according to an embodiment of the invention. The digital memory may be any structure, device, or system employed for the storage of digital data, including, but not limited to, magnetic tape, magnetic disc, optical disc, and IC memory such as ROM, SRAM and DRAM. Error location information for errors detected in a digital memory is received (operation 102). A group of the errors that are associated with the same error position is identified from the error location information (operation 104). In one embodiment, the error position may be the position of a detected error within an addressable location of the digital memory. A number of the errors in the group that are associated with the same area of the digital memory is identified (operation 106). In one embodiment, an area of the digital memory may include a subset of the plurality of addressable memory locations comprising the digital memory. In one particular implementation, the addressable locations of an area may be a physical subdivision of the digital memory. A persistent error is determined based upon the number of the errors of the group (operation 108).

Figure 2:
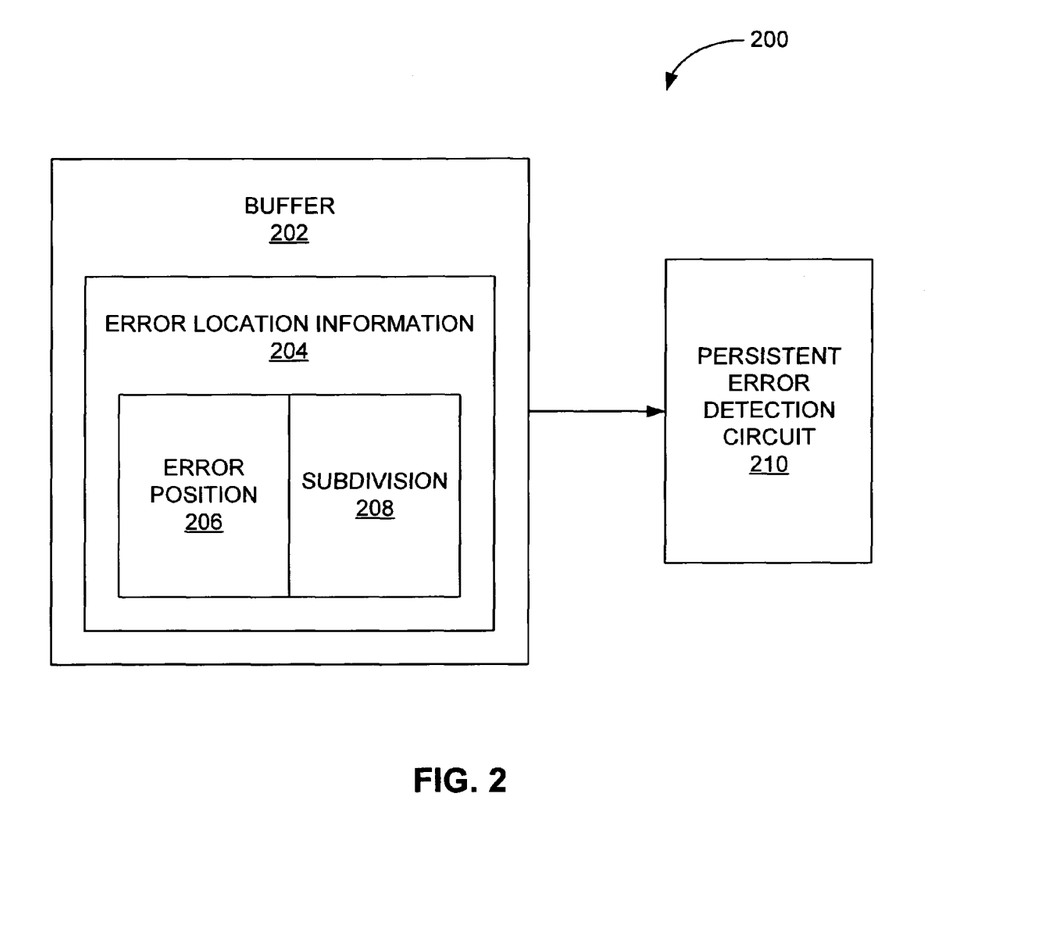
FIG. 2 is a block diagram of an apparatus for detecting a persistent error in a digital memory according to an embodiment of the invention.

FIG. 2 depicts an apparatus 200 for detecting a persistent error in a digital memory according to an embodiment of the invention. The apparatus 200 includes a buffer 202 configured to receive error location information 204 for errors detected in a digital memory. The error location information 204 includes an error position 206 for each of the plurality of errors, and an area or subdivision 208 of the digital memory for each of the errors. The apparatus 200 further includes a persistent error detection circuit 210 coupled with the buffer 202 and configured to identify from the error location information a group of the errors that are associated with a first error position 206. The persistent error detection circuit 210 is also configured to identify a number of the errors within the group that are associated with a first subdivision 208 of the digital memory, and determine a persistent error based upon the number of the errors of the group.

Figure 3:
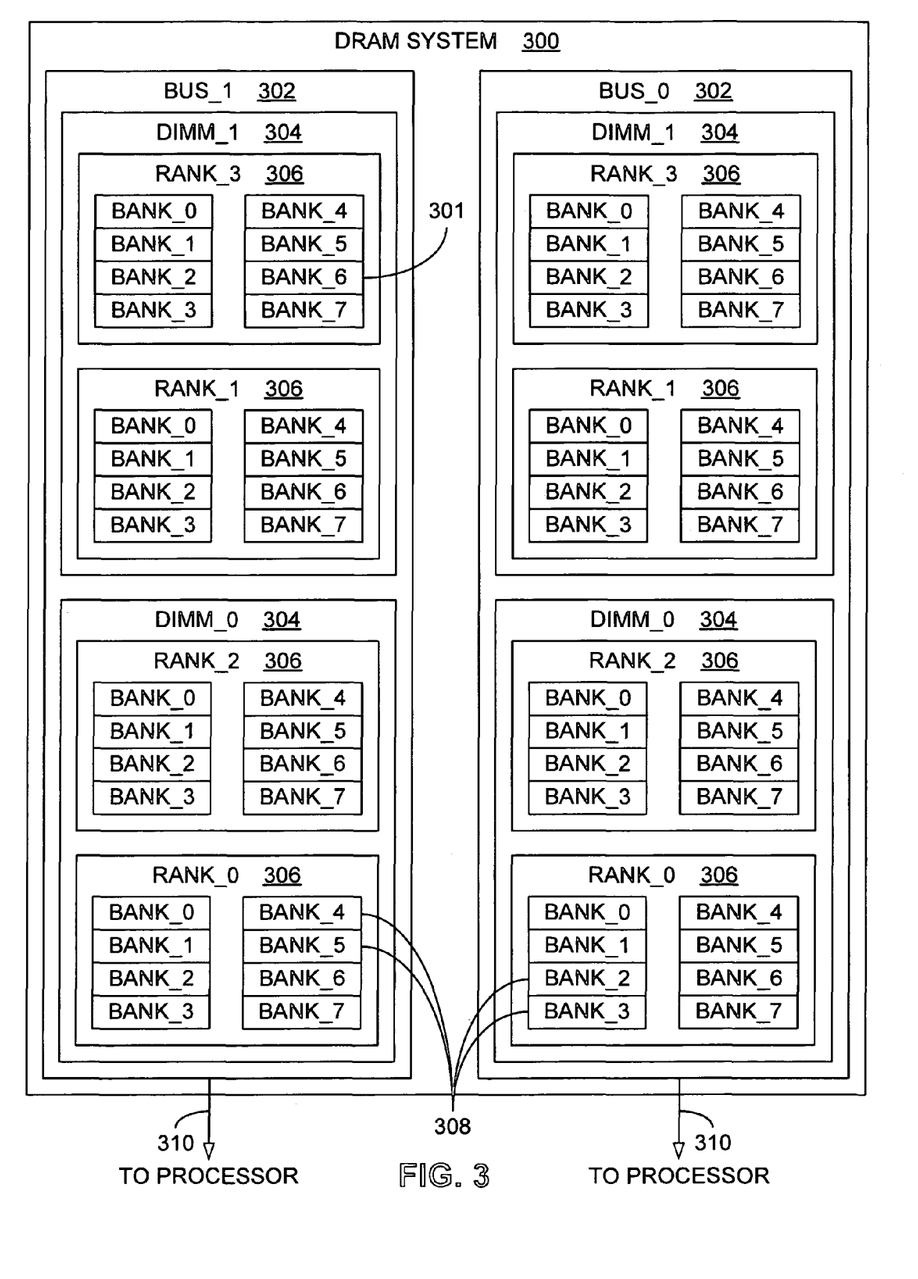
FIG. 3 is a simplified block diagram of a dynamic random-access memory (DRAM) system.

To explain a particular embodiment of the invention employed for use with IC memory, FIG. 3 provides a logical illustration of a DRAM system 300. In this example, the DRAM system 300 resides on a single printed circuit board coupled with a processor (not shown) of a computer system by way of a pair of DRAM busses 310. The DRAM system 300 is physically structured as a hierarchy of subdivisions of DRAM memory. Each subdivision represents a subset of the addressable memory locations of the DRAM system 300.

More specifically, the DRAM system 300 is subdivided into two DRAM bus subsystems 302, labeled "Bus_0" and "Bus_1," each of which is coupled with a processor by way of a separate DRAM bus 310. Each DRAM bus is composed of electronic signals required to write and read the various addressable locations of the DRAM system 300. These signals include data lines, address lines, a row address strobe, a column address strobe, read and write signals, and so on.

Figure 4:
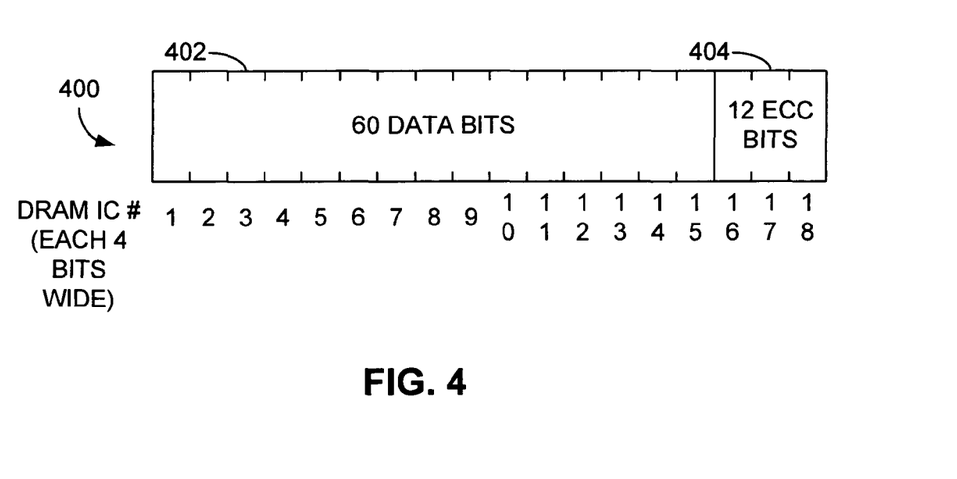
FIG. 4 is a logical representation of an addressable memory location within the DRAM system of FIG. 3.

Each DRAM bus subsystem 302 is further subdivided into two dual in-line memory modules (DIMMs) 304, termed "DIMM_0" and DIMM_1." Typically, each DIMM 304 is comprised of several DRAM ICs residing on both sides of a small printed circuit board coupled with the main circuit board of the DRAM system 300 by way of a small connector. Each DRAM IC on the DIMM 304 provides storage for a number of bit positions for each of a number of addressable locations. FIG. 4 provides one possible example of an addressable memory location 400 of a DIMM 304 which includes 72 bits of storage, 60 of which are data bits 402, and 12 of which are ECC bits 404. The ECC bits 404 provide redundancy information to allow correction of the data bits 402 by an error correction system, as described above. In one example, 15 DRAM ICs with 4-bit-wide data busses provide the 60 data bits for a series of addressable locations, while three DRAM ICs with a 4-bit-wide data bus supplies the 12 ECC bits for those same locations, as shown in FIG. 4.

Similarly, each of the DIMMs 304 includes two ranks 306, collectively representing a "rank pair." Typically, the DRAM ICs on one side of the DIMM 304 board comprise a single rank 306. Each rank 306 provides half of the addressable memory locations supported by the associated DIMM 304. Conversely, in other DRAM systems employing single in-line memory modules (SIMMs), only a single side of the module board is populated with DRAM ICs, typically representing a single rank that provides all of the addressable locations of the SIMM. In the DRAM system 300 of FIG. 3, each of the four ranks 306 associated with each of the bus portions 302 (i.e., BUS_0 and BUS_1) provide a quarter of the addressable memory space therein. As a result, the four ranks 306 are labeled "Rank_0," "Rank_1," "Rank_2," and "Rank_3," even though the ranks 306 reside on two separate DIMMs 304.

In the particular DRAM system 300 of FIG. 3, each rank 306 consists of eight DRAM banks 308 labeled "Bank_0" through "Bank_7," wherein each bank 308 contains storage for one-eighth of the addressable memory locations of its associated rank 306. In many cases, DRAM ICs each provide multiple banks of addressable locations to allow interleaving of read and write accesses among the banks to eliminate access delays associated with the precharge and row access strobe times normally identified with each DRAM data access. In other DRAM systems, fewer, or only one, bank of addressable locations may be provided in a rank.

The DRAM system 300 of FIG. 3 represents just one possible type of digital memory system. Many other subdivision configurations employing DRAM ICs exist. Also, other IC memory systems involving various technologies, such as ROM, SRAM, and the like, which employ a plethora of memory configurations are also possible.

In addition, other forms of digital memory, such as magnetic tape memory systems, and magnetic and optical disc memory systems, may also exhibit subdivisions of addressable memory locations. For example, disc systems normally contain addressable locations termed sectors, each of which contains hundreds or thousands of data and ECC bytes. Each byte is a group of bits collectively constituting a symbol representing a possible error position within its associated sector. The sectors may be grouped in several different arrangements, such as by track, by zone, by disc surface and so on, thus representing several different possible subdivisions of the digital memory provided by a particular disc memory system.

As with all digital memories, the DRAM system 300 provides varying types of potential defect mechanisms, thus allowing the production of transient and persistent errors in the data stored in the system 300. Typically, transient errors are data errors of a generally random, non-recurring nature, such as that caused by infrequent or one-time electrical noise events causing incorrect reading or writing of data. On the other hand, persistent errors are data errors typically caused by permanent or recurring defects involving or related to the digital memory. Permanent defects may include, for example, defective memory components, broken electronic signal traces or wires, short circuits, defects in recording media, and so on. Recurring defects may include, for example, intermittent circuit failures due to elevated temperatures, loose circuit connections sensitive to vibration, and read/write failures caused by periodic electrical noise generated by nearby circuitry. A persistent defect need not be permanent in nature, nor need it occur frequently for it to be considered persistent. Thus, the decision of whether a particular error is considered persistent or transient is a matter of design choice, as is described in greater detail below.

Oftentimes, particular classes of persistent defects are associated with a specific type of subdivision of the memory system. For example, referring to the DRAM system 300 of FIG. 3, an internal defect of a DRAM IC may affect a specific bit of each addressable location within a single bank 308. However, a complete failure of a DRAM IC is likely to cause errors in a range of bits of each addressable location of an entire rank 306 or two. An error of even greater scope occurs if a contact for a data bit signal on the connector for one of the DIMMs 304 creates a short circuit, thus causing a particular bit for each addressable location of the DIMM 304 to be erroneous. Similarly, persistent defects occurring at one of the DRAM busses 310 may cause one or more bits of half of the addressable locations of the system 300 to fail. Further, a defective connection of the printed circuit board housing the entire DRAM system 300 with a processor may cause specific bits of each addressable memory location to yield incorrect data as well. Thus, the scope of any particular persistent data error may depend on the location and nature of the specific defect causing the error.

As discussed above, the capability to detect the position of a persistent error within an addressable location of digital memory typically allows the enhancement of an error correction scheme to detect and correct greater numbers of data errors at that addressable location. In addition, identifying the likely scope of the affected addressable locations of each persistent error further enhances error correction by identifying potential errors in addressable locations rarely or yet-to-be accessed. The detection of persistent errors, along with the identification of their likely scope, is provided by the embodiment discussed below.

Figure 5:
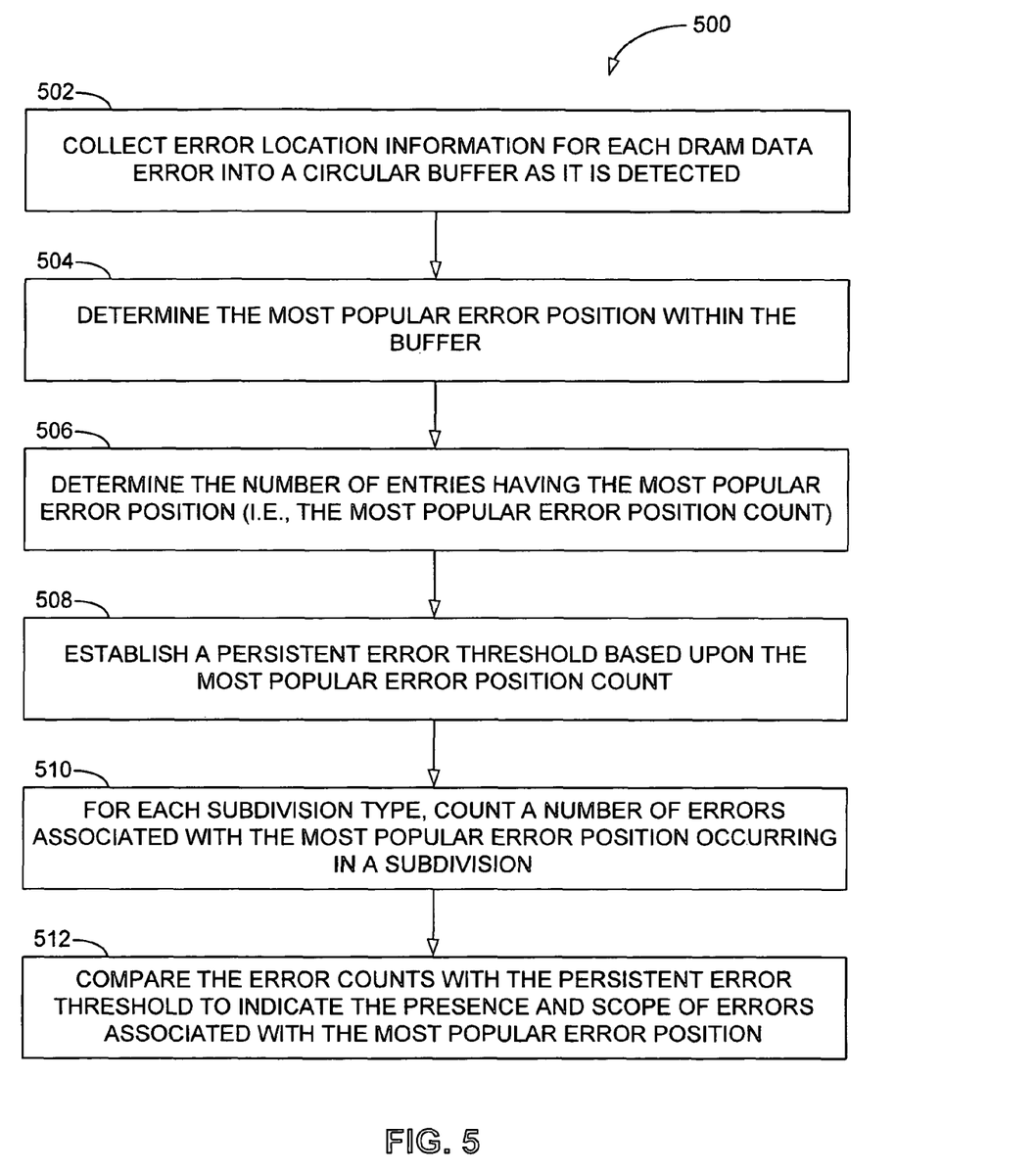
FIG. 5 is a flow chart of a method according to an embodiment of the invention for detecting persistent errors in the DRAM system of FIG. 3.

FIG. 5 illustrates by way of a flow chart a method 500 of detecting data errors in the DRAM system 300 of FIG. 3, and determining the likely scope of those errors. Error location information for each data error detected in the DRAM system 300 is collected as it is detected (operation 502). Typically, the error location information for both transient and persistent data errors is generated by an error correction system employed for detecting and correcting data errors in the DRAM system 300.

Figure 6:
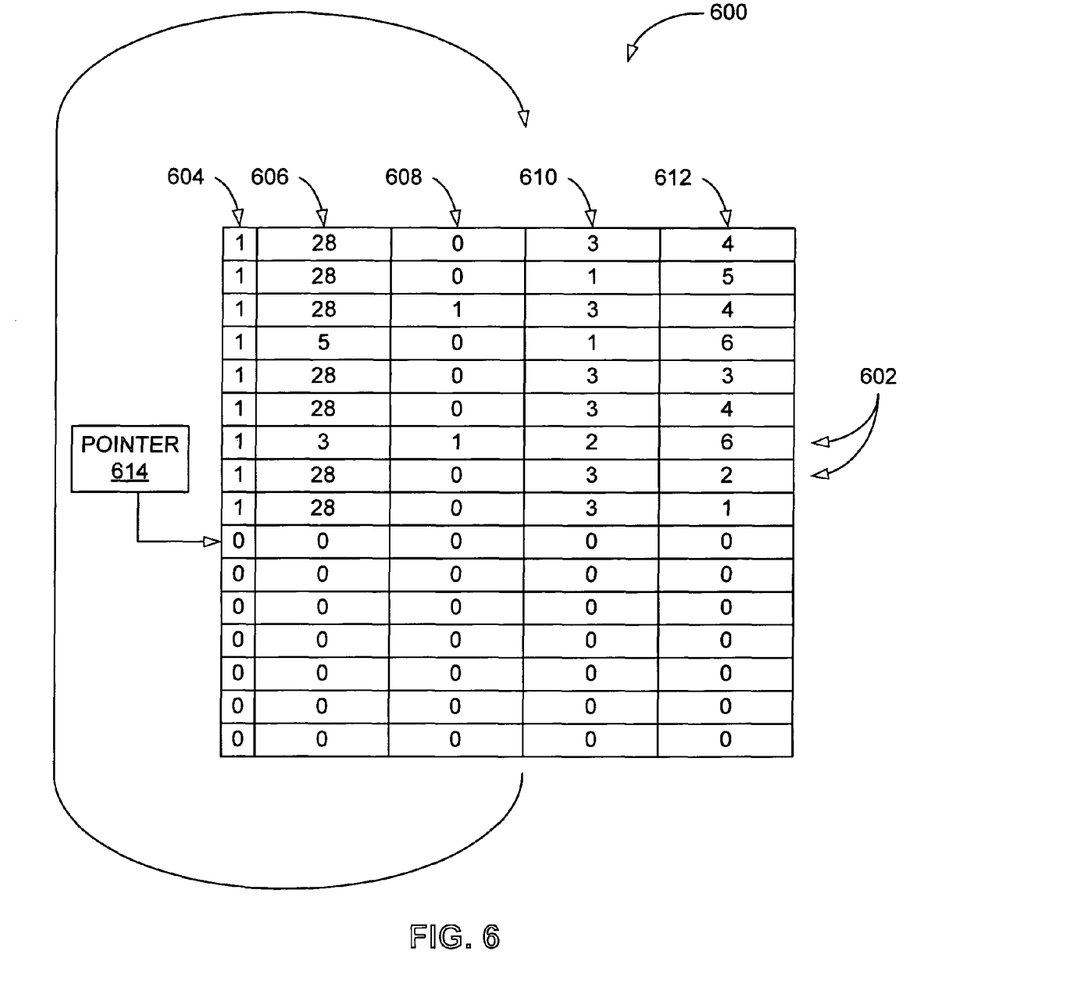
FIG. 6 is logical representation of a buffer for receiving error location information for the DRAM system of FIG. 3 according to an embodiment of the invention.

In one embodiment, the error location information for each error is placed in a circular buffer 600, as shown in FIG. 6, so that information concerning the most recently detected data errors is maintained. In alternative implementations, other memory configurations, such as a first-in, first-out (FIFO) buffer may be utilized. In one implementation, the buffer 600 contains sixteen entries 602, although many other lengths for the buffer may be employed in the alternative. Associated with the buffer 600 is a buffer pointer 614 for indicating the next entry 602 in the buffer 600 to be filled. Each entry 602 includes a "valid" bit 604 indicating whether the fields in the entry 602 contain valid error location information. Also residing within each entry 602 are a position field 606, a bus field 608, a rank field 610, and a bank field 612 to indicate the location of each detected data error within the DRAM system 300 represented in the buffer 600.

The position field 606 of each entry 602 indicates the bit position of the detected data error within the affected addressable location of the DRAM system 300. For example, in the case of the DRAM system 300, wherein each addressable memory location contains 32 bits of data and 8 bits of ECC, for a total of 40 bits, the position field 606 may contain a value ranging from 0 to 39. In other digital memory technologies, such as magnetic or optical disc, the position field 606 may indicate the relative position of a byte within an addressable data sector.

Similarly, each of the bus field 608, the rank field 610, and the bank field 612 indicate the location within the DRAM system 300 of the addressable location containing the detected error. For example, for a detected data error location 301 as denoted in FIG. 3, its associated buffer entry 602 would contain a bus field 608 indicating Bus_1, a rank field 610 indicating Rank_3 (thereby also indicating DIMM_1), and a bank field 612 indicating Bank_6. Typically, the information contained within the bus field 608, the rank field 610, and the bank field 612 are readily derived from the address of the addressable location of the corresponding data error.

Referring again to the method of FIG. 5, when each data error is collected in the buffer 600, the most popular error position within an addressable location, as indicated by the position fields 606 of the buffer 600 that contain valid error position data, is determined (operation 504). The number of valid entries 602 containing that bit position value, referred to as the most popular error position count, is also established (operation 506). These operations may be performed by a persistent error detection circuit 210 of FIG. 2 having access to the entries 602 of the buffer 600. In another embodiment, other bit position values in addition to the most popular value, and their counts within the buffer 600, may be determined as well.

The most popular error position count is then employed to establish a persistent error threshold (operation 508). This operation may also be performed by the persistent error detection circuit 210, as depicted in FIG. 2 and described above, which is tasked with determining the existence and scope of a persistent error associated with the most popular error position 606. In one embodiment, the persistent error threshold is derived from a maximum difference between the most popular bit position count and the number of entries 602 containing the most popular error position 606 also sharing a particular subdivision of the DRAM system 300, as indicated by the bus field 608, rank field 610, and/or bank field 612 of each entry 602. In another embodiment, the magnitude of the difference employed to derive the value of the threshold may depend upon the value of the popular error position count. In that case, the higher the count, the higher the allowable difference between the count and the number of entries indicating the same subdivision. For example, assuming a buffer 600 having sixteen total entries 602, a difference of only one may be allowed for a popular count of less than six in order to denote the associated error as persistent. In other words, at least five entries 602 indicating the same error position (by way of the position field 606) and the same subdivision of the addressable address space (indicated by the bus field 608, the rank field 610, and/or the bank field 612) would be required for detection of a persistent error. However, a difference of two may be allowed for a popular count of 7 through 11 inclusive, while a difference of three for popular counts higher than 11 may be tolerated while still associating the most popular error position 606 with a persistent error in a particular subdivision. In alternative embodiments, a separate threshold for the most popular bit position count may be employed so that low values for the most popular bit position count may not give rise to labeling as persistent the data errors having the most popular error position 606. Generally, establishing specific values for one or more thresholds for persistent error detection determines how consistently data errors residing at a particular bit position must appear within a particular subdivision of the DRAM system 300 for the error to be considered persistent.

For each subdivision type (for example, the bus 302, DIMM 304, rank 306, and bank 308 subdivisions of the DRAM system 300), the number of data errors associated with the most popular error position 606 occurring within the same subdivision are counted (operation 510). As shown in the particular example of FIG. 6, seven valid entries 602 of the buffer 600 exhibit the same value of 28 in the bit position field 606. Of those entries 602, six have a bus field 608 value of 0 (indicating Bus_0), while one has a bus field 608 value of one (for Bus_1). Similarly, of the six entries 602 associated with Bus_0, five correspond with Rank_3. However, only two of the five entries 602 associated with Bus_0, Rank_3, were detected within the same bank 308 (Bank_4). In one embodiment, this counting functionality may also be performed by the persistent error detection circuit 210 shown in FIG. 2.

Each of the counts calculated above is compared to an appropriate persistent error threshold established earlier to indicate the presence and potential scope of the defect associated with the most popular error position (operation 512). Using FIG. 6 again as an example, the difference between the most popular error position count (seven, as indicated in the bit position field 606) and the number of valid entries 602 for errors at that bit position residing in Bus_0 (six, as indicated in the bus field 608) is one, possibly indicating the presence of a persistent error. Further, the difference between the most popular error position count and the number of valid entries 602 for the most popular error position occurring in Rank_3 (six, indicated in the rank field 610) also results in a difference of one. However, since the highest number of errors within the seven valid entries 602 exhibiting the most popular error position occurring within a single bank is three, (Bank_4, as indicated by the bank field 612), the persistent error threshold is not met at the bank subdivision level. Thus, based on this particular information, a persistent error at error position 28 with a likely scope of Bus_0, Rank_3, is indicated. This specific persistent error position and scope may then be provided to the error correction system associated with the DRAM system 300 to further enhance the correction capabilities of the error correction system when data errors at bit position 28 of the addressable memory locations within Bus_0, Rank_3 are detected. In one embodiment, the persistent error detection circuit 210 discussed above performs this function.

In an alternative embodiment of the invention, a newly-determined persistent error, with its likely scope, may be compared against other previously-indicated persistent errors before presenting the new persistent error to the error correction system. Such additional functionality may prevent duplication of persistent error indications. Further, such a comparison may lead to updating the scope of a previously-detected persistent error based on newer error location information not available at the time the persistent error was previously indicated.

In one embodiment, the information from one or more separate fields 608, 610, 612 of an entry 602 may be combined to identify the scope of a detected persistent error not limited to a single area or subdivision identified by the fields 608, 610, 612. In the case of the DRAM system 300, the rank field 610 may be employed to determine if the scope of a detected persistent error is limited to a particular DIMM 304, each of which includes two ranks. For example, presuming in the example of FIG. 6 that instead of six valid entries 602 with the same error position field 606 value having a rank field 610 indicating Rank_3, three of the six entries 602 display a rank field 610 indicating Rank_3, and the remaining three indicate Rank_1. Thus, the separate counts associated with Rank_1 and Rank_3 do not indicate a scope of a persistent error at the rank 306 subdivision level. However, as the combined counts for the subdivisions of Rank_1 and Rank_3 of DIMM_1 together may indicate a persistent error at the DIMM 304 subdivision level, DIMM_1 may be indicated as the scope of the persistent error, even though the DIMM 304 subdivision level is not specifically represented by any of the fields 608, 610, 612 in the buffer 600.

In another implementation, smaller alternative areas or subdivisions may be counted for persistent error scope purposes only if they reside within a larger subdivision indicated as the location of a persistent error. More specifically, using FIG. 6 as an example, while the number of entries 602 having the most popular error position field 606 value of 28 occurring within Rank_3 (as indicated in the rank field 610) is six, only five of these entries 602 occurs within Bus_0 (as indicated in the bus field 608). Thus, the count relating to the rank 306 subdivision level to be compared against the persistent error threshold would be five in this particular implementation. In addition, the bank field 612 of FIG. 6 may be analyzed in a similar fashion. Restricting the count for a particular subdivision in this manner helps ensure that only those lower subdivisions residing with a higher subdivision associated with a persistent error are counted in determining if the lower subdivision denotes the proper scope of the error.

As discussed above, embodiments of the invention may be embodied in an electronic logic circuit performing the functions of the buffer 202 and the persistent error detection circuit 210. In one embodiment, these functions reside within an application-specific integrated circuit (ASIC) or similar electronic device. In an alternative embodiment, the methods and functions described above may be implemented within software, firmware, or the like stored in any form of digital memory, such as ROM, RAM, disc, tape, and so on. Typically, the software or related form of algorithm may be executed on a processor, microprocessor, microcontroller, or other algorithmic processing device or system.

While several embodiments of the invention have been discussed herein, other embodiments encompassed by the scope of the invention are possible. For example, while some embodiments of the invention as described above are specifically employed for the detection of persistent errors in DRAM systems, other forms of digital memory, such as ROM, SRAM, magnetic tape, magnetic disc, optical disc, and the like may also benefit from application or adaptation of the various embodiments, as presented above. Further, aspects of one embodiment may be combined with those of alternative embodiments to create further implementations of the present invention. Thus, while the present invention has been described in the context of specific embodiments, such descriptions are provided for illustration and not limitation. Accordingly, the proper scope of the present invention is delimited only by the following claims.

What is claimed is:

1. A method for detecting a persistent error in a digital memory, the method comprising:
   receiving error location information for errors detected in the digital memory, wherein the digital memory comprises addressable memory locations;
   identifying from the error location information a group of the errors that are associated with a same error position within at least one of the addressable memory locations;
   identifying a number of the errors of the group that are associated with a same area of the digital memory, wherein the area comprises a number of the addressable memory locations, and wherein a size of the area is selected from at least two possible values; and
   determining a persistent error based upon the number of the errors of the group;
   wherein a digital storage medium comprising a set of instructions executable on an algorithmic processing device is used to employ the method for detecting a persistent error in the digital memory.

2. The method of claim 1, wherein determining the persistent error comprises specifying the persistent error when the number of the errors of the group exceeds a threshold.

3. The method of claim 2, wherein specifying the persistent error comprises:
   specifying a persistent error position comprising the error position; and
   specifying a persistent error scope comprising the area.

4. The method of claim 1, wherein receiving the error location information is performed circularly as each of the errors is detected.

5. The method of claim 1, further comprising detecting the errors in the digital memory.

6. The method of claim 1, wherein the error position comprises a bit position within at least one of the addressable memory locations of the digital memory.

7. The method of claim 1, wherein the area comprises a physical subdivision of the digital memory.

8. The method of claim 1, wherein the area comprises one of a bus, a rank, a rank pair, or a bank of a dynamic random-access memory system.

9. The method of claim 1, further comprising identifying a second number of the errors of the group that are associated with a same second area of the digital memory, wherein a larger area comprises the first area and the second area; and
   wherein determining the persistent error is further based upon the second number of the errors of the group.

10. The method of claim 9, wherein specifying the persistent error comprises:
    specifying a persistent error position comprising the error position; and
    specifying a persistent error scope comprising the larger area.

11. A digital memory system employing the method of claim 1.

12. An apparatus for detecting a persistent error in a digital memory having addressable memory locations, the apparatus comprising:
    a buffer configured to receive error location information for errors detected in the digital memory, the error location information comprising an error position within at least one of the addressable memory locations for each of the errors, and a subdivision comprising a number of the addressable memory locations of the digital memory for each of the errors, wherein a size of the subdivision is selected from at least two possible values; and
    a persistent error detection circuit coupled with the buffer and configured to identify from the error location information a group of the errors that are associated with a first error position, identify a number of the errors of the group that are associated with a first subdivision of the digital memory, and determine a persistent error based upon the number of the errors of the group.

13. The apparatus of claim 12, wherein the persistent error detection circuit determines a persistent error by providing a persistent error indication when the number of the errors of the group exceeds a threshold.

14. The apparatus of claim 13, wherein the persistent error indication comprises:
    a persistent error position comprising the first error position; and
    a persistent error scope comprising the first subdivision.

15. The apparatus of claim 12, wherein the buffer is a circular buffer configured to receive the error location information as each of the errors is detected.

16. The apparatus of claim 12, further comprising an error detection circuit coupled with the buffer and the digital memory, and configured to detect the errors.

17. The apparatus of claim 12, wherein each of the error positions comprises a bit position within one of the addressable memory locations of the digital memory.

18. The apparatus of claim 12, wherein each of the subdivisions comprises a physical subdivision of the digital memory.

19. The apparatus of claim 12, wherein each of the subdivisions of the digital memory comprises one of a bus, a rank, a rank pair, or a bank of a dynamic random-access memory system.

20. The apparatus of claim 12, the error location information further comprising an alternative subdivision of the plurality of addressable locations for each of the errors; and
    wherein the persistent error detection circuit is configured to identify a second number of the errors of the group that are associated with a first alternative subdivision, and determine the persistent error based also upon the second number of the errors of the group, wherein a larger subdivision comprises the first subdivision and the first alternative subdivision.

21. A digital storage system comprising the apparatus of claim 12.

22. An apparatus for detecting a persistent error in a digital memory, the apparatus comprising:
- means for receiving error location information for each of a plurality of errors detected in the digital memory, the error location information comprising an error position within at least one of a plurality of addressable locations of the digital memory, and a subdivision of the digital memory within which the one of the plurality of addressable locations resides, wherein the subdivision comprises a number of the addressable memory locations, and wherein a size of the subdivision is selected from at least two possible values;
- means for identifying from the error location information a group of the plurality of errors that are associated with a first error position;
- means for identifying a number of the errors of the group that are associated with a first subdivision of the digital memory; and
- means for indicating a persistent error based upon the number of the errors of the group.

23. The apparatus of claim 22, wherein the indicating means comprises means for producing a persistent error indication when the number of the errors of the group exceeds a threshold.

24. The apparatus of claim 23, wherein the persistent error indication comprises:
- a persistent error position comprising the first error position; and
- a persistent error scope comprising the first subdivision.

25. The apparatus of claim 22, wherein the receiving means is configured to receive the error location information as each of the plurality of errors is detected in a circular manner.

26. The apparatus of claim 22, further comprising means for detecting the plurality of errors.

27. The apparatus of claim 22, wherein each of the error positions comprises a bit position within one of the plurality of addressable memory locations of the digital memory.

28. The apparatus of claim 22, wherein each of the subdivisions comprises a physical subdivision of the digital memory.

29. The apparatus of claim 22, wherein each of the subdivisions of the digital memory comprises one of a bus, a rank, a rank pair, or a bank of a dynamic random-access memory system.

30. The apparatus of claim 22, the error location information further comprising an alternative subdivision of the plurality of addressable locations for each of the plurality of errors, wherein the subdivision comprises the alternative subdivision;
- wherein the means for identifying the number of the errors of the group that are associated with the first subdivision also identifies a second number of the errors of the group that are associated with a first alternative subdivision; and
- wherein the indicating means indicates the persistent error also based upon the second number of the errors of the group, wherein a larger subdivision comprises the first subdivision and the first alternative subdivision.

31. A digital storage system comprising the apparatus of claim 22.

* * * * *